United States Patent
Ueda

(10) Patent No.: US 7,635,907 B2
(45) Date of Patent: Dec. 22, 2009

(54) SEMICONDUCTOR DEVICE WITH ELECTRIC FUSE HAVING A FLOWING-OUT REGION

(75) Inventor: Takehiro Ueda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/797,704

(22) Filed: May 7, 2007

(65) Prior Publication Data

US 2007/0262414 A1 Nov. 15, 2007

(30) Foreign Application Priority Data

May 9, 2006 (JP) .............................. 2006-130702

(51) Int. Cl.
H01L 29/00 (2006.01)
H01L 21/82 (2006.01)

(52) U.S. Cl. ............... 257/529; 257/249; 257/E23.149; 438/132

(58) Field of Classification Search ................. 257/529; 438/132
See application file for complete search history.

(56) References Cited

U.S. PATENT DOCUMENTS 4,064,493 A 12/1977 Davis

2004/0262710 A1* 12/2004 Ueda ........................... 257/529
2005/0029620 A1* 2/2005 Ueda ........................... 257/529
2005/0285222 A1 12/2005 Thei et al.

FOREIGN PATENT DOCUMENTS

| JP | 2004-186590 | 7/2004 |
|---|---|---|
| JP | 2005-39220 | 2/2005 |
| JP | 2005-57186 | 3/2005 |

* cited by examiner

Primary Examiner—Matthew Smith
Assistant Examiner—Walter H Swanson
(74) Attorney, Agent, or Firm—Young & Thompson

(57) ABSTRACT

A semiconductor device includes an electric fuse formed on a semiconductor substrate and composed of an electric conductor. The electric fuse includes an upper layer interconnect, a via coupled to the upper interconnect and a lower layer interconnect coupled to the via, which are formed in different layers, respectively, in a condition before cutting the electric fuse, and wherein the electric fuse includes a flowing-out region formed of the electric conductor being flowed toward outside from the second interconnect and a void region formed between the first interconnect and the via or in the via, in a condition after cutting the electric fuse.

14 Claims, 9 Drawing Sheets

FLOW OF ELECTRONS

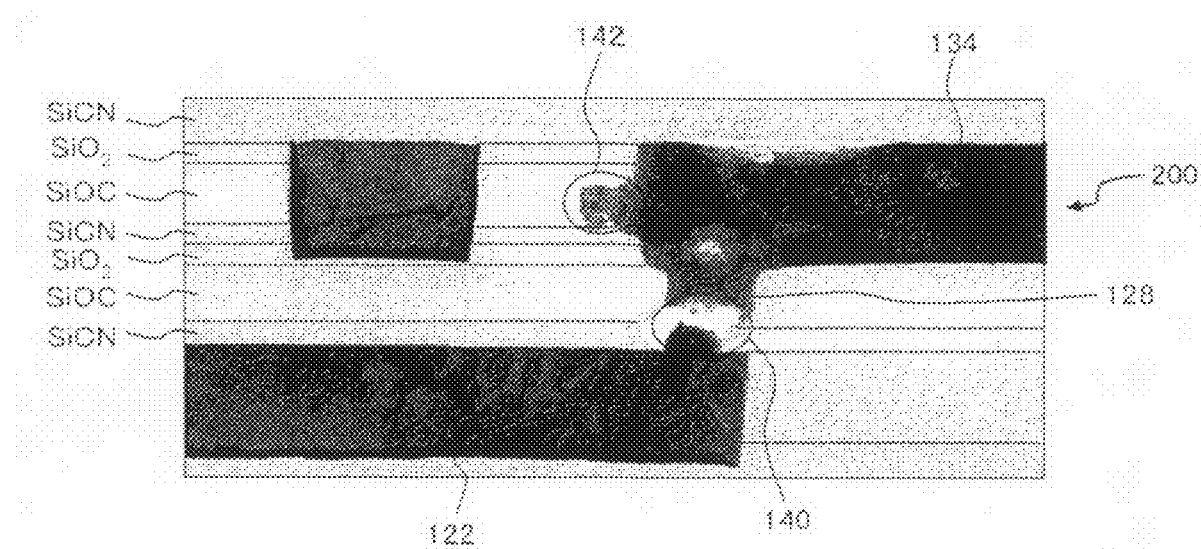

SEMICONDUCTOR DEVICE WITH ELECTRIC FUSE HAVING A FLOWING-OUT REGION

This application is based on Japanese patent application No. 2006-130,702, the content of which is incorporated hereinto by reference.

BACKGROUND

1. Technical Field

The present invention relates to a semiconductor device and a method for cutting electric fuse, and particularly relates to a semiconductor device including an electric fuse and a method for cutting such electric fuse.

2. Related Art

A technology is conventionally known, in which a fuse is mounted in a semiconductor device, and the electric fuse is broken, so that a value of a resistor employed in the semiconductor device is suitably adjusted, or a failure element is separated and replaced into a normal element.

Typical manner for cutting a fuse includes cutting an electric fuse by irradiating a laser beam in a portion of the fuse and cutting a fuse by applying an electric current.

U.S. Pat. No. 4,064,493, Japanese Laid-open patent publication No. 2005-39,220 and Japanese Laid-open patent publication No. 2005-57,186 disclose an electric fuse, which is capable of being broken by utilizing a phenomenon, in which a material constituting the electric fuse migrates by an electromigration.

Japanese Laid-open patent publication No. 2005-39,220 discloses an electric fuse, which is breakable with a smaller current. In Japanese Laid-open patent publication No. 2005-39,220, an electric conductor constituting an electric fuse is formed to have a geometry that the conductor is turned back for several folds. FIG. 9 is a plan view, showing an electric fuse disclosed in Japanese Laid-open patent publication No. 2005-39,220. In this case, a fuse 1100 includes two folds of turn-back.

The fuse 1100 includes a current inflow terminal 1101 and a current drain terminal 1102, and further includes a first forward path straight line 1103, a return path straight line 1104 and a second forward path straight line 1113 between both of the terminals. The fuse 1100 further includes a first perpendicular coupling portion 1106, which provides a coupling between the first forward path straight line 1103 and the return path straight line 1104, and a second perpendicular coupling portion 1107, which provides a coupling between the second forward path straight line 1113 and the return path straight line 1104. When a predetermined current is supplied from current inflow terminal 1101 into current drain terminal 1102 in the fuse 1100 having the above-described configuration, the heats generated in the hatched portions 1108 outside of the fuse 1100 are added to the heats generated in the hatched portions 1109 inside of the fuse 1100, accelerating the breaking of the return path straight line 1104 sandwiched with the hatched portions 1109. This provides easily cutting the fuse 1100.

Moreover, Japanese Laid-open patent publication No. 2005-57,186 has disclosed a configuration in which, when a current is applied to a fuse, heat generated in a portion of the fuse, which is to be cut, is trapped or accumulated in the neighborhood of the portion in the fuse, which is to be cut, by enclosing the portion with a plate.

Japanese Laid-open patent publication No. 2004-186,590 discloses a semiconductor device, which is provided with an electrically conducting layer and an insulating film formed in this order in or above a semiconductor substrate, and also provided with a connecting hole that extends through the insulating film and reaches an upper surface of the conducting layer. The semiconductor device includes an interconnect layer, which includes a flat portion formed on the insulating film and a curved portion formed integrally with the flat portion and formed on a side surface and a bottom surface of the connecting hole, the curved portion defining a hollow portion that has a geometry tapered toward an upside thereof. In this case, a geometry of the interconnect layer formed in the connecting hole is curved, and have a reduced thickness in the lower portion of the connecting hole. The structure of such interconnect layer is a fuse element structure, and a resistivity thereof is increased as the thickness is reduced, so that a minimum current value for cutting an electrical coupling between the lower interconnect layer and the overlying interconnect layer can be reduced. It is described that such configuration provides a simultaneous pursuit of a suitable fuse element structure, which is capable of being broken with a smaller current density, and a suitable multiple-layered interconnect structure.

The present inventor has recognized as follows. The hollow portion is formed in the connecting hole in a condition before cutting the fuse element in the technology described in Japanese Laid-open patent publication No. 2004-186,590. Therefore, an extra operation is additionally required for forming such the hollow portion. Further, it is required to form an insulating film on the hollow portion under a process condition that avoids filling the hollow portion, leading to limiting the formation method of the insulating film. Further, such fuse element structure may also causes a problem, in which the structure can not be manufactured simultaneously with forming a dual damascene multiple-layered interconnect structure that involves simultaneously forming vias and interconnects.

Further, it is also considered as described in U.S. Pat. No. 4,064,493, Japanese Laid-open patent publication No. 2005-39,220 and Japanese Laid-open patent publication No. 2005-57,186 that, when a fuse is broken by employing a phenomenon that a material constituting the fuse migrates via an electromigration, a heat treatment conducted on the semiconductor device after the cutting of the fuse may possibly cause a migration of the material via an electromigration again to re-connecting the fuse at the broken point. If such unwanted re-connection is created, an appropriate result of a detection of a cutting status of the electric fuse can not be obtained, even if the electric fuse to be cut is cut once.

Although it is considered that a possibility of occurring the re-connection as described above is not very high and thus there is no problem in employing thereof for ordinary operations, it is required to enhance a property for maintaining a cutting condition of the electric fuse, when a reliability of the semiconductor device is highly demanded or when the semiconductor device is employed in extreme conditions.

The present inventor has found a novel technique for cutting electric fuses by utilizing an electric current, which is different from conventional method for cutting fuses.

SUMMARY

According to the present invention, there is provided a semiconductor device, including: a semiconductor substrate; and an electric fuse formed on the semiconductor substrate and composed of an electric conductor, wherein the electric fuse includes a first interconnect, a via coupled to the first interconnect and a second interconnect coupled to the via, which are formed in different layers, respectively, in a condition before cutting the electric fuse, and wherein the electric fuse includes a flowing-out region formed of the electric conductor being flowed toward outside from the second interconnect and a void region formed between the first interconnect and the via or in the via, in a condition after cutting the electric fuse.

The present inventor has found a novel technique for cutting electric fuses, in which a constitution of an electric fuse or a manner for applying an electric voltage to an electric fuse is suitably controlled, so that a part of an electric conductor that constitutes an electric fuse is forced to be flowed toward outside of the electric fuse leading to losing a balance between a migration and a supply of the electric conductor material, thereby forming a larger cut part in other part when the electric fuse is cut or broken. This allows maintaining an improved condition in cutting or breaking of a cut electric fuse.

The electric fuse of the present invention includes a different feature from conventional electric fuses that a "flowing-out region" is formed in the condition after cutting the electric fuse. Here, the term "outside" may be construed as an outside of a region where the second interconnect is formed in the condition before cutting the electric fuse, and may be construed as, for example, an outside of an interconnect trench where the second interconnect is formed. Such configuration allows forming larger void region as a cut part. Further, since the void region is provided in a different location from the location of the flowing-out region, a possibility of a reconnection of the cut electric fuse can be considerably reduced.

Further, according to the semiconductor device of the present invention, the electric fuse includes a first interconnect, a via coupled to the aforementioned first interconnect and a second interconnect coupled to the aforementioned via, which are formed in different layers, respectively, in the condition before cutting the electric fuse. An excessive electric power is applied to the electric fuse having such configuration, so that a flowing-out region can be formed in an interconnect section having larger area along a direction in the surface of the semiconductor substrate and a void region can be provided in a via section having smaller area along a direction in the surface of the semiconductor substrate. More specifically, by constituting an electric fuse with a connecting structure of interconnects and via, the flowing-out region and the void region can be easily formed. Further, this allows maintaining an improved condition in cutting or breaking of a cut electric fuse.

According to the present invention, there is provided a method for cutting an electric fuse, the electric fuse including a first interconnect, a via coupled to the first interconnect, and a second interconnect coupled to the via, which are formed on a semiconductor substrate, composed of an electric conductor and formed in different layers, respectively, including: applying a predetermined electric voltage between the first interconnect and the second interconnect to apply an electric current to the electric fuse such that the electric conductor is flowed toward outside from the second interconnect to form a void region between the via and the first interconnect or in the via.

Since the electric conductor that constitutes the electric fuse is flowed toward outside from the second interconnect in the condition after cutting the electric fuse according to the method for cutting an electric fuse of the present invention, larger void region can be formed as a cut part. Further, since the void region is provided in a different location from the location where the electric conductor is flowed out, a possibility of a reconnection of the cut electric fuse can be considerably reduced. This allows maintaining an improved condition in cutting or breaking of a cut electric fuse.

According to the present invention, there is provided a method for manufacturing a semiconductor device, including: selecting a fuse to be cut; and cutting the selected electric fuse by the above-described method for cutting the electric fuse.

According to the present invention, an improved condition in cutting of a cut electric fuse can be maintained.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 8 shows a cross-sectional view, which was formed by actually forming an electric fuse having an interconnect structure of a single damascene structure similar as shown in FIG. 6A and then cutting the formed fuse via a crack assist type process.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

In embodiments of the present invention, an electric fuse may be composed of a multiple-layered structure including an interconnect, a via and an interconnect. The interconnects and the via may be configured of being formed in respective insulating films. Further, the electric conductor that constitutes the interconnects and the via may be composed of a copper-containing metallic film that contains copper as a major constituent. Further, side surfaces and bottom surfaces of interconnects and the via may be configured to be coated with barrier metal films, respectively. In addition, the top surfaces of the interconnects may be configured of being provided with a barrier insulating film formed thereon.

In the present embodiment, the electric fuse having such configuration is cut (or broken) in the following procedure.

(1) An excessive power is applied to the electric fuse to inject an excess amount of electron, for example, from the upper interconnect, thereby heating the interconnects and the via.

(2) The heated electric conductor constituting the interconnects and the via expands to create cracks in the peripheral insulating films and the barrier metal films. At this time, the cracks are generated in a periphery of the interconnect having larger area in a direction in the surface of the semiconductor substrate (in other words, interconnect having larger volume).

(3) The electric conductor flows into the cracks in the insulating film and the barrier metal film to reduce a density of the electric conductor constituting the electric fuse.

(4) Correspondingly, a portion of the electric conductor in the via section having smaller area in the direction in the surface of the semiconductor substrate (in other words, via section having smaller volume) is drawn up toward a direction, in which the electric conductor flows out. This provides creating a cut part on the via section, thereby cutting the electric fuse.

Here, the method for cutting the electric fuses via the above-mentioned technique is referred to as "crack assist type" process. First of all, operations for cutting an electric fuse by a crack assist type process will be described.

Figure 1A:
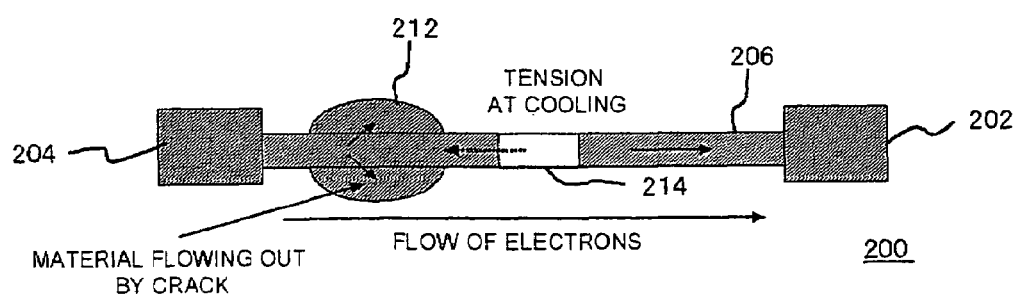
FIGS. 1A to 1C are diagrams, showing a condition in a case where an electric fuse is broken in an embodiment of the present invention.
Figure 1B:
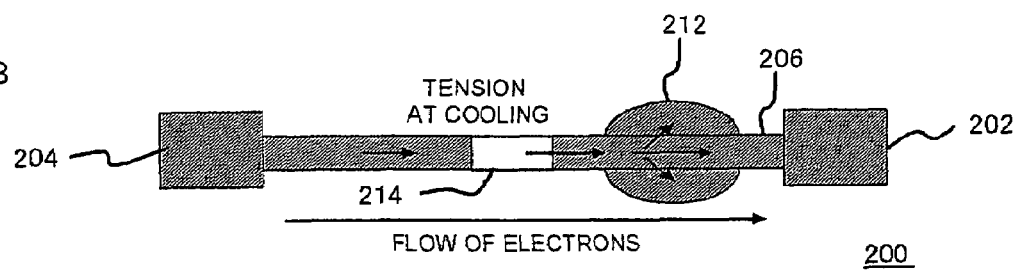
Figure 1C:
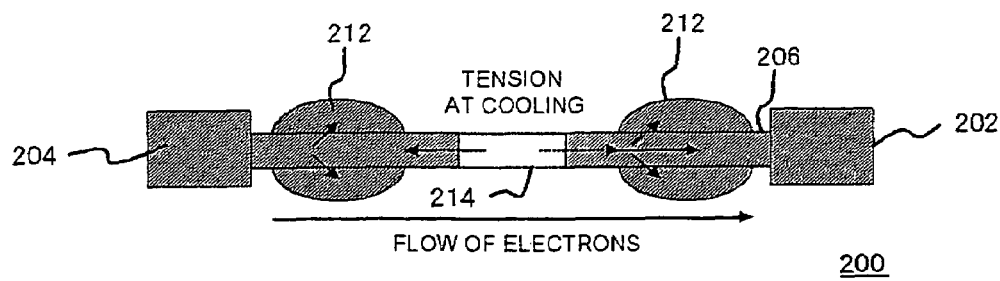

FIGS. 1A to 1C are diagrams, showing a condition in a case where an electric fuse is broken via a crack assist type process.

An electric fuse 200 includes an electric conductor 206 and a combination of a first terminal 202 and a second terminal 204, which are provided in one end and another ends thereof, respectively. The electric conductor 206 constitutes the interconnects and the via. In this case, the elements are shown by utilizing straight lines for the purpose of simplifying the descriptions. The electric fuse 200 is an electric fuse (E fuse), in which the electric conductor 206 is cut by applying an electric current between the first terminal 202 and the second terminal 204. The electric fuse 200 may be formed on a semiconductor substrate (not shown). Here, in the cutting of the electric fuse 200, the first terminal 202 is set at a higher voltage ($V_{cc}$, for example), and the second terminal 204 is set at a lower voltage (grounding, for example). This allows applying an electric current toward a direction to the second terminal 204 from the first terminal 202. Therefore, electron migrates toward a direction to the first terminal 202 from the second terminal 204. When an electric current having a value of current that is larger than a predetermined value is applied between the first terminal 202 and the second terminal 204, a flowing-out region 212, which is formed of the electric conductor 206 being flowed toward outside thereof, is formed. In addition, due to a formation of the flowing-out region 212, the electric conductor 206 rapidly migrates toward a direction to the flowing-out region 212 to form a cut part 214.

When the cut part 214 is created in the electric conductor 206, a passage of an electric current through the conductor 206 is stopped, thereby gradually cooling off the electric conductor 206. At this time, when the flowing-out region 212 is formed to be closer to the second terminal 204 than the cut part 214 as shown in FIG. 1A, for example, a tensile stress (tension) generated due to the cooling is exerted toward a direction to the flowing-out region 212 from the cut part 214, between the flowing-out region 212 and the cut part 214, so that the electric conductor 206 migrates toward the flowing-out region 212. Besides, between the cut part 214 and the first terminal 202, the electric conductor 206 migrates toward the first terminal 202 by an influence of electron transfer when an electric current is applied between the first terminal 202 and the second terminal 204. This allows the electric conductor 206 migrating toward the opposite directions at both sides of the cut part 214, thereby forming sufficiently larger cut part 214.

In addition, when the flowing-out region 212 is formed to be closer to the first terminal 202 than the cut part 214 as shown in FIG. 1B, for example, a tensile stress generated due to the cooling is exerted toward a direction to the flowing-out region 212 from the cut part 214, between the cut part 214 and the flowing-out region 212, so that the electric conductor 206 migrates toward the flowing-out region 212. At this time, between the cut part 214 and the second terminal 204, the electric conductor 206 migrates toward the cut part 214 by an influence of electron transfer when an electric current flowed between the first terminal 202 and the second terminal 204. However, an amount of the portion of the electric conductor 206 that migrates toward the cut part 214 is much smaller than an amount of the portion of the electric conductor 206 that migrates toward the flowing-out region 212. In addition, in the present embodiment, larger quantity of the electric conductor 206 flows into the flowing-out region 212 in the cutting of the electric fuse 200, thereby providing an increased dimension of the cut part 214. This allows maintaining sufficiently larger cut part 214.

Besides, when the flowing-out regions 212 are formed in two locations between cut part 214 and the first terminal 202 and between the cut part 214 and the second terminal 204 as shown in FIG. 1C, for example, a tensile stress generated due to the cooling is exerted toward directions to the two flowing-out regions 212, so that the electric conductor 206 migrates toward directions to two of separated flowing-out regions 212. This allows the electric conductor 206 migrating toward the opposite directions at both sides of the cut part 214, thereby forming sufficiently larger cut part 214.

Next, a method for applying an electric voltage to the electric fuse 200 will be described. As described above, in the present embodiment, an excessive power is applied to the electric fuse 200 to form the flowing-out region 212 at the electric conductor 206 and to create the cut part 214. In the present embodiment, a voltage of around 2 to 5 Volts, for example, is applied across the first terminal 202 and the second terminal 204. This allows forming the flowing-out region 212 and the cut part 214 in the electric fuse 200.

Figure 2:
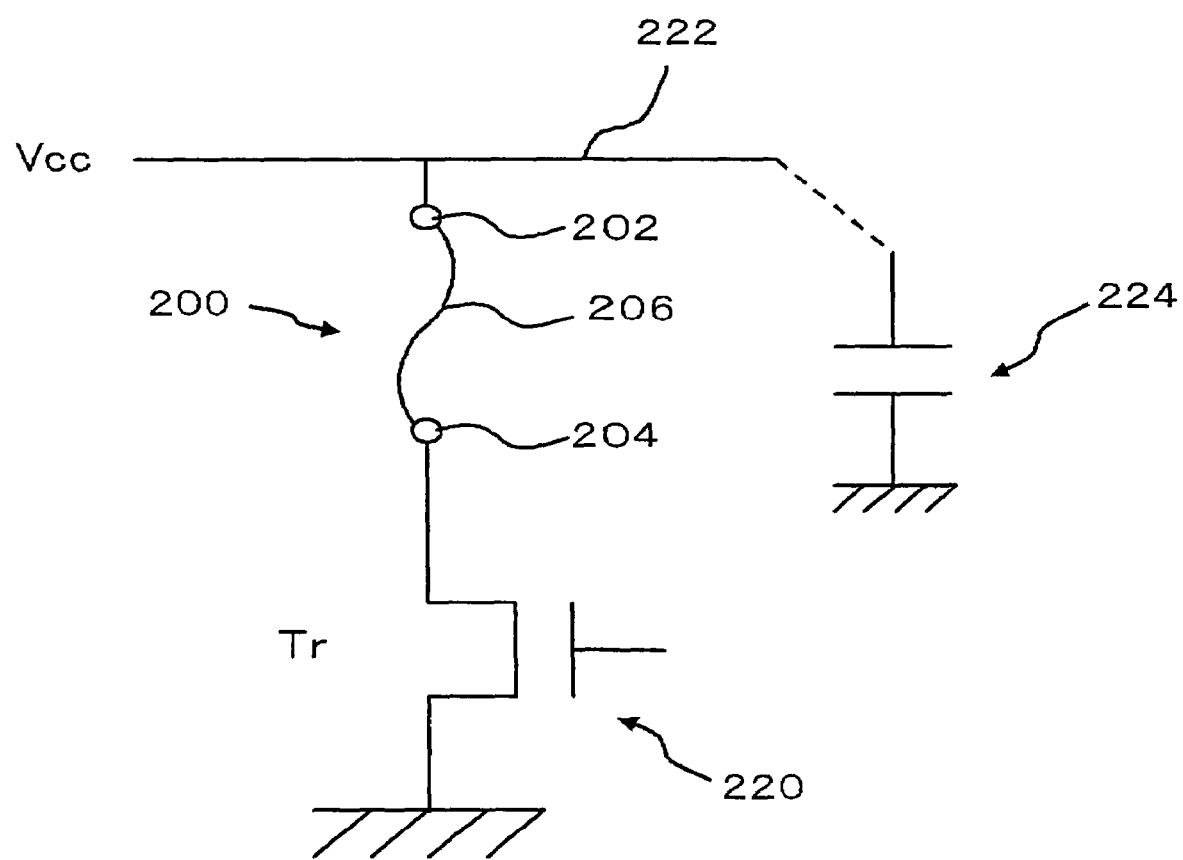
FIG. 2 is a circuit schematic, showing a circuit architecture including the electric fuse.

FIG. 2 is a circuit schematic, showing a circuit architecture including the electric fuse 200. The first terminal 202 of the electric fuse 200 is coupled to a power line 222, and the second terminal 204 is coupled to one of the source and the drain of the transistor 220. The other of the source and the drain of the transistor 220 is grounded. Besides, though it is not shown here, a plurality of electric fuses 200 are formed on the semiconductor substrate, and a plurality of electric fuses 200 are coupled to the power line 222. Therefore, the power line 222 is in a condition provided with a floating capacitance 224 added thereto. A procedure for cutting the electric fuse 200 in the thus configured circuit will be described.

In the present embodiment, the power line 222 is turned on and the transistor 220 is turned on, so that a power supply voltage $V_{cc}$ is applied to the first terminal 202 and the second terminal 204 is grounded, thereby allowing to flow an electric current in the electric conductor 206. As a result, a cut part is created in the electric conductor 206. Meanwhile, when a voltage is to be applied to the electric fuse 200, the power line 222 may be firstly turned on, and then the transistor 220 may be turned on.

Figure 3:
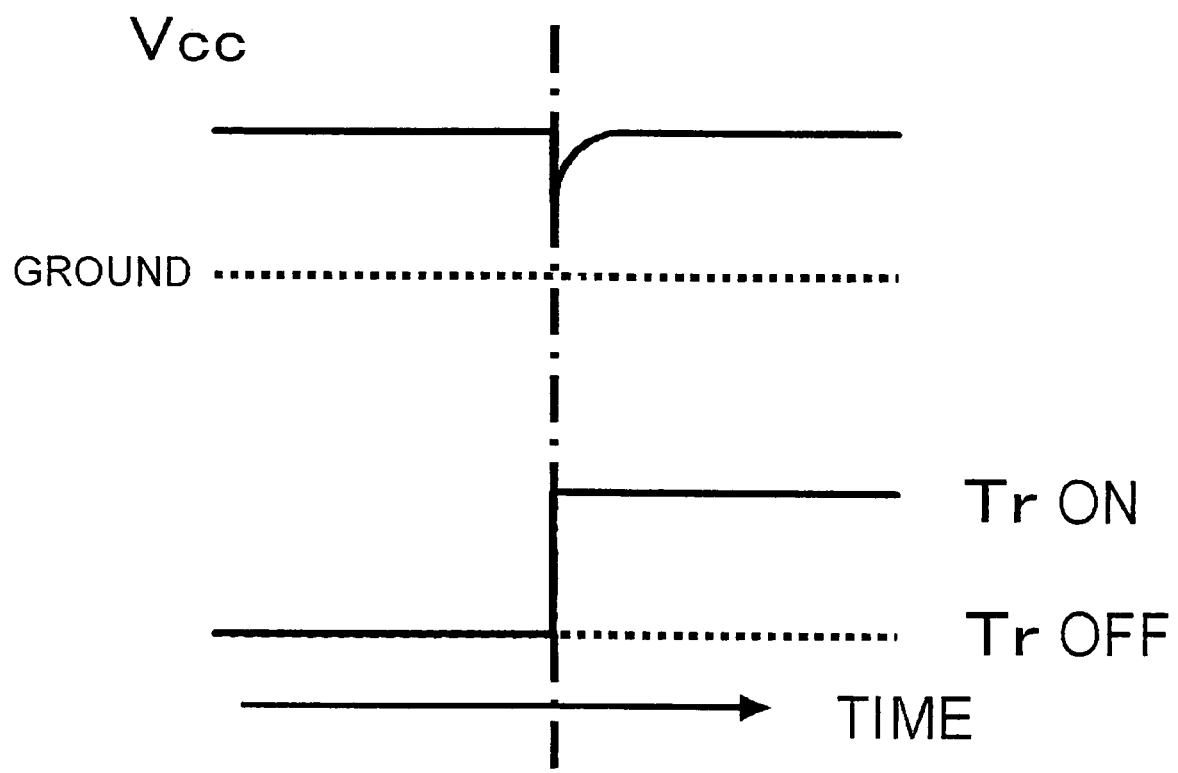
FIG. 3 is a timing chart, illustrating a timing of the transistor being turned on and an electrical voltage applied to the first terminal of the electric fuse.

FIG. 3 is a timing chart, illustrating a timing of the transistor being turned on and an electrical voltage applied across the first terminal and the second terminal of an electric fuse. In the chart, a lower solid line indicates a condition of on/off of the transistor 220, and an upper solid line indicates a condition of a potential applied to the first terminal 202 of the electric fuse 200. A timing for turning on the transistor 220 is indicated by a dash line. When the transistor 220 is turned on after the power line 222 is turned on, a voltage drop is instantly and temporarily created at a timing when the transistor 220 is turned on, and then, the potential is immediately recovered at $V_{cc}$. Therefore, at a point in time when the transistor 220 is turned on, an electrical voltage $V_{cc}$ is applied across the both ends of the electric fuse 200, leading to the situation where an excessive power is applied to the electric fuse 200. This allows forming the flowing-out region 212 by flowing the electric conductor 206 toward outside thereof, and forming the larger cut part 214.

Figure 4:
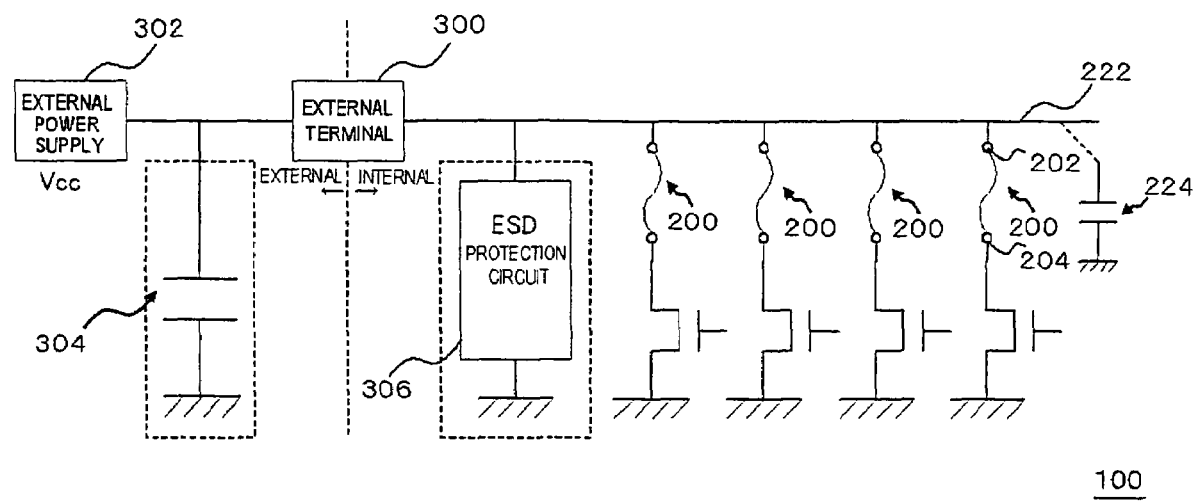
FIG. 4 is a circuit schematic, showing an another exemplary circuit architecture of the semiconductor device including a plurality of electric fuses.

FIG. 4 is a circuit schematic, showing another exemplary circuit architecture of the semiconductor device 100 including a plurality of electric fuses 200. Meanwhile, the first terminal 202 may be coupled to a circuit having a capacitance that is capable of accumulating a quantity of electric charge, which is sufficiently larger than a decrease in electric charge due to the cutting of the electric fuses 200. The power line 222 is coupled to an external power source 302 through an external terminal 300. Further, the power line 222 is coupled to circuits having sufficiently larger capacitance, such as, for example, an external capacitance 304, an electrostatic discharge (ESD) protection circuit 306 and the like. The external capacitance 304 may be configured of being provided outside of the chip such as, for example, a probe card and the like. The power line 222 may be configured of being coupled to both of the external capacitance 304 and the ESD protection circuit 306, or may be configured of being coupled to one of these circuits.

Here, for example, a capacitance of a floating capacitance 224 is presented as $C_0$, and capacitance of one of the external capacitance 304 and the ESD protection circuit 306, which is coupled to the power line 222, is presented as $C_1$. Assuming that a voltage supplied from external power source 302 is presented as $V_{cc}$, a quantity of electric charge Q accumulated in the semiconductor device 100 before the electric fuse 200 is cut can be presented as:

$Q=(C_0+C_1) \times V_{cc}$.

Assuming that an electric current that flows when cutting the electric fuse 200 is presented as $I_{cut}$, and a time required for cutting the electric fuse 200 is presented as $T_{cut}$ a decrease in an electric charge due to cutting the electric fuses 200 can be presented as:

$\Delta Q = I_{cut} \times T_{cut}$.

In the present embodiment, $C_0$ and $C_1$ may be selected to satisfy:

$\Delta Q/Q < 0.01$       (formula 1).

This can prevent a voltage drop, which is otherwise instantly and temporarily created at a timing when the transistor 220 is turned on as shown in FIG. 3. In addition to above, when a large number of electric fuses 200 are coupled to the power line 222 and thus the above-described formula 1 is satisfied only with capacitance $C_0$ of the floating capacitance 224, a configuration, in which the external capacitance 304 and ESD protection circuit 306 are not coupled to the power line 222, may alternatively be employed. Further, when formula 1 is satisfied only with the capacitance $C_0$ and either of the external capacitance 304 and the ESD protection circuit 306, a configuration, in which either of the external capacitance 304 and the ESD protection circuit 306 is coupled to the power line 222, may alternatively be employed.

By presenting the semiconductor device 100 having the above described configuration, and by applying an electric voltage in a procedure described in reference to FIG. 3, the electric conductor 206 is cut by an excessive electric power. This allows forming the flowing-out region 212 by flowing the electric conductor 206 toward outside thereof, thereby forming the larger cut part 214.

In the next, a specific configuration of the electric fuse 200 in the present embodiment will be described. In the present embodiment, the electric fuse 200 is constituted by utilizing a multiple-layered interconnect structure.

Figure 5A:
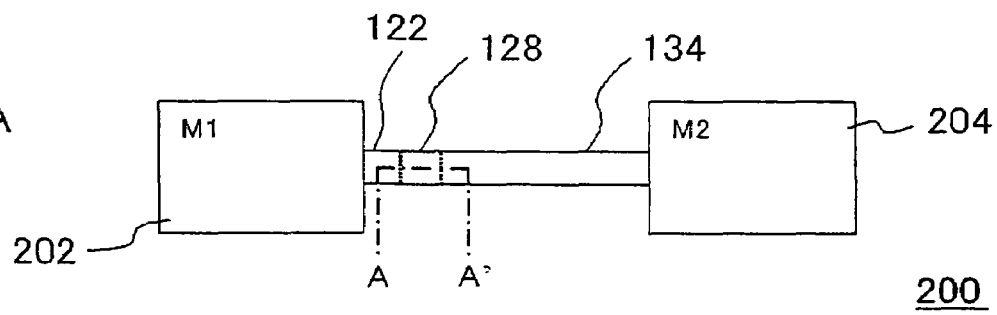
FIGS. 5A and 5B are schematic plan views, showing a configuration of the electric fuse in the present embodiment.
Figure 5B:
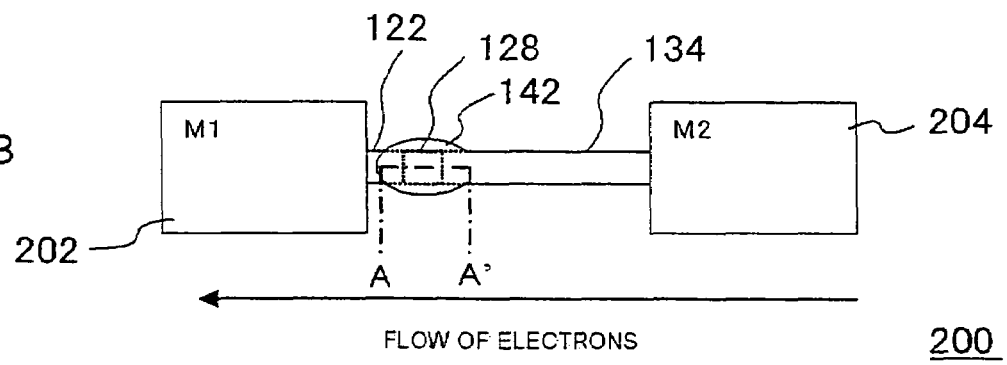

FIGS. 5A and 5B are schematic plan views, showing a configuration of the electric fuse 200 in the present embodiment.

Here, the first terminal 202 and a lower layer interconnect 122 (first interconnect) are formed in a lower layer. The second terminal 204 and an upper layer interconnect 134 (second interconnect) are formed in an upper layer. The lower layer interconnect 122 is electrically coupled to the upper layer interconnect 134 through a via 128 formed in a layer between the upper layer and the lower layer.

FIG. 5A is a diagram, showing a condition before cutting the electric fuse. In the present embodiment, the lower layer interconnect 122 and the upper layer interconnect 134 may be formed to be asymmetric, for the purpose of having different volumes. For example, the lower layer interconnect 122 and the upper layer interconnect 134 may be formed to have different areas in a two-dimensional arrangement along a direction in the surface of the semiconductor substrate. Having such configuration, when an electric current is flowed between the first terminal 202 and the second terminal 204, one of the interconnects having larger volume more considerably expands than other of the interconnects, thereby selectively forming a flowing-out region in such interconnect having larger volume.

The first terminal 202 and the second terminal 204 may be formed to have wider widths than the lower layer interconnect 122 and the upper layer interconnect 134. As an example, widths of the lower layer interconnect 122 and the upper layer interconnect 134 are selected as 0.1 μm, and widths of the first terminal 202 and the second terminal 204 may be selected as 0.3 μm. However, since wider linewidth leads to a capability of easily releasing a heat, when the first terminal 202 and the second terminal 204 having wider linewidth are provided in vicinity of the interconnect for forming the flowing-out region, there may be a fear that the formation of the flowing-out region is difficult and that the cutting of the electric fuse 200 is difficult. Therefore, when the first terminal 202 and the second terminal 204 are formed to have wider widths than the lower layer interconnect 122 and the upper layer interconnect 134, the first terminal 202 and the second terminal 204 may be provided in locations remote from a flowing-out region and a cut part by certain distances. Further, the first terminal 202 and the second terminal 204 may alternatively be formed to have same linewidth as the lower layer interconnect 122 and the upper layer interconnect 134.

In the exemplary implementation shown in FIGS. 5A and 5B, the upper layer interconnect 134 is formed to have larger area in a two-dimensional arrangement along a direction in the surface of the semiconductor substrate than the lower layer interconnect 122. Here, it is assumed that the film thickness of the lower layer interconnect 122 is substantially same as that of the upper layer interconnect 134. Having such configuration, a volume of the upper layer interconnect 134 becomes larger than the volume of lower layer interconnect 122. In such configuration, an application of an excessive electric power between the first terminal 202 and the second terminal 204 causes a passage of an electric current through the electric fuse 200, so that an electric conductor composing the lower layer interconnect 122, the via 128 and the upper layer interconnect 134 is heated to be expanded. Here, the largest force of the heated electric conductor exerting the periphery thereof is created in the upper layer interconnect 134 having larger volume.

This allows the electric conductor easily flowed toward the outside thereof at the upper layer interconnect 134, thereby forming the flowing-out region 142 at the upper layer interconnect 134, as shown in FIG. 5B. Further, when the flowing-out region 142 is formed at the upper layer interconnect 134, the electric conductor migrates toward the flowing-out region 142, the portion of the electric conductor constituting the via 128 is drawn up toward the flowing-out region 142. As a result, a void region is formed in the via 128.

Figure 6A:
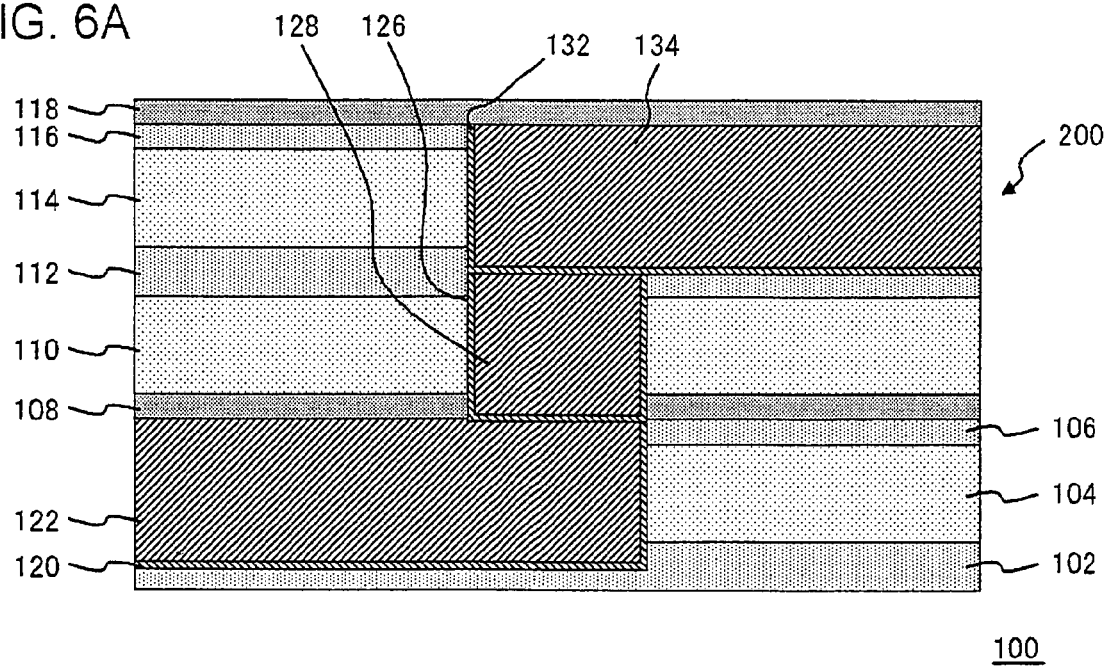
FIGS. 6A and 6B show an example of cross-sectional views along line A-A' of FIGS. 5A and 5B, respectively.
Figure 6B:
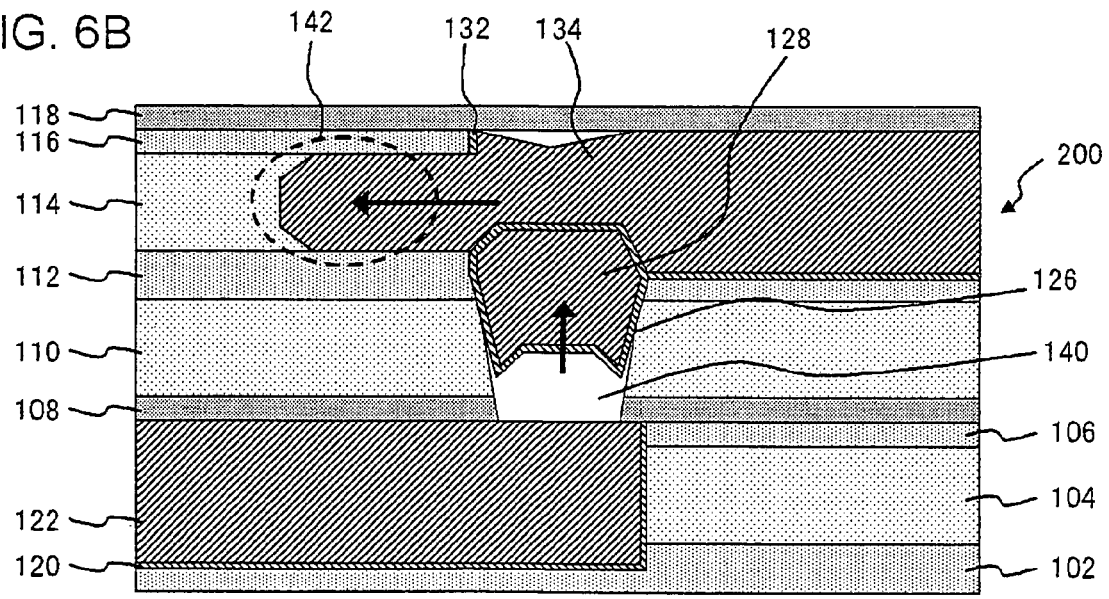

FIGS. 6A and 6B show an example of cross-sectional views along line A-A' appeared in FIGS. 5A and 5B, respectively. FIG. 6A is a cross-sectional view, showing the configuration of semiconductor device 100 before cutting the electric fuse 200, and FIG. 6B is a cross-sectional view, showing the configuration of semiconductor device 100 after cutting the electric fuse 200. In this case, the interconnect structure of a single damascene structure is shown.

As shown in FIG. 6A, the semiconductor device 100 includes a semiconductor substrate (not shown), and the following films formed in the following sequences on the semiconductor substrate: a first etch stop film 102; a first interlayer insulating film 104; a first protective film 106; a second etch stop film 108; a second interlayer insulating film 110; a third etch stop film 112; a third interlayer insulating film 114; a second protective film 116; and a fourth etch stop film 118.

In the condition before cutting the electric fuse, the electric fuse 200 includes a lower layer interconnect 122, a via 128 electrically coupled to the lower layer interconnect 122 and an upper layer interconnect 134 electrically coupled to the via 128. Here, the lower layer interconnect 122 is formed in the first etch stop film 102, the first interlayer insulating film 104 and the first protective film 106. Further, the via 128 is formed in the second etch stop film 108, the second interlayer insulating film 110 and the third etch stop film 112. Further, the upper layer interconnect 134 is formed in the third etch stop film 112, the third interlayer insulating film 114 and the second protective film 116.

The lower layer interconnect 122, the via 128 and the upper layer interconnect 134 are composed of an electric conductor corresponding to the electric conductor 206 of FIGS. 1A to 1C. The electric conductor may be composed of a copper-containing metallic film containing copper as a major constituent. The copper-containing metallic film may additionally include silver. Further, the copper-containing metallic film may have a composition additionally containing one or more different element(s) selected from a group consisting of aluminum (Al), gold (Au), platinum (Pt), chromium (Cr), molybdenum (Mo), tungsten (W), magnesium (Mg), beryllium (Be), zirconium (Zn), palladium (Pd), cadmium (Cd), mercury (Hg), silicon (Si), zirconium (Zr), titanium (Ti) and tin (Sn). The copper-containing metallic film may be formed via a plating process, for example. Further, the surface of the copper-containing metallic film may be configured of, for example, provided with a silicide film formed thereon.

Further, the side surface and the bottom surface of the lower layer interconnect 122, the via 128 and the upper layer interconnect 134 are provided with the first barrier metal film 120, the second barrier metal film 126 and the third barrier metal film 132, respectively, which are provided so as to contact with and cover these interconnects and via. The barrier metal film may be configured to include a refractory metal. The first barrier metal film 120, the second barrier metal film 126 and the third barrier metal film 132 may be composed of, for example, tantalum (Ta), tantalum nitride (TaN), Ti, titanium nitride (TiN), W, tungsten nitride (WN) or the like.

More specifically, in the condition before cutting the electric fuse 200, the second barrier metal film 126 is provided between the lower layer interconnect 122 and the via 128 so as to be in contact therewith. Further, the third barrier metal film 132 is provided between the via 128 and the upper layer interconnect 134 so as to be in contact therewith.

The first interlayer insulating film 104 and the third interlayer insulating film 114 may be composed of a low dielectric constant film such as silicon oxycarbide (SiOC) and the like. Typical low dielectric constant film includes, in addition to SiOC, poly hydrogen siloxane such as hydrogen silsesquioxane (HSQ), methyl silsesquioxane (MSQ), methylated hydrogen silsesquioxane (MHSQ) and the like, aromatic compound-containing organic materials such as poly aryl ether (PAE), divinyl siloxane-bis-benzocyclobutene (BCB), SILK $^{TR}$ (commercially available from Hitachi Chemical Co., Ltd., Tokyo Japan) and the like, silicon oxide glass (SOG), a flowable-oxide (FOX), CYTOP $^{TR}$ (commercially available from Asahi Glass Co., Ltd., Tokyo Japan), or benzocyclobutene (BCB). Alternatively, a porous film of the above-described material may also be employed for the low dielectric constant film. The first interlayer insulating film 104 and the third interlayer insulating film 114 may be composed of the same material, or may be composed of different materials.

In addition, the second interlayer insulating film 110 may be composed of the material similar as that described above concerning the first interlayer insulating film 104 and the third interlayer insulating film 114. However, in relation to the first interlayer insulating film 104 and the third interlayer insulating film 114, the second interlayer insulating film 110 may preferably be composed of a harder material than the first interlayer insulating film 104 and the third interlayer insulating film 114. For example, the second interlayer insulating film 110 may be composed of a material having higher Young's modulus than that of the first interlayer insulating film 104 and the third interlayer insulating film 114. Such configuration allows easily forming the flowing-out region 142 at the interconnect section.

In addition to above, the configuration of the second interlayer insulating film 110 is not limited to such configuration, and may also be composed of a material similar to that of the first interlayer insulating film 104 and the third interlayer insulating film 114. Since the via 128 has very smaller area along the direction in the surface of the semiconductor substrate as compared with the interconnect in this case, the flowing-out region 142 can be selectively formed at the interconnect section.

The second etch stop film 108 and the fourth etch stop film 118 function as etch stop films utilized in forming the via hole and the interconnect trench, and also function as preventing a diffusion of copper constituting the lower layer interconnect 122 and the upper layer interconnect 134. In addition, these also function as coating films for the electric fuse 200 in the present embodiment. The second etch stop film 108 and the fourth etch stop film 118 may be composed of a harder material than the first interlayer insulating film 104 and the third interlayer insulating film 114. The second etch stop film 108 and the fourth etch stop film 118 may be composed of a material having higher Young's modulus than that of the first interlayer insulating film 104 and the third interlayer insulating film 114. The second etch stop film 108 and the fourth etch stop film 118 may be composed of for example, silicon carbonitride (SiCN), silicon nitride (SiN), silicon carbide (SiC), silicon oxyfluoride (SiOF) or silicon oxynitride (SiON).

The first protective film 106 and the second protective film 116 function as protecting the first interlayer insulating film 104 and the third interlayer insulating film 114, respectively, when the lower layer interconnect 122 and upper layer interconnect 134 are polished via a chemical mechanical polishing (CMP) process. The first protective film 106 and the second protective film 116 may be composed of, for example, silicon dioxide ($SiO_2$) films.

The first etch stop film 102 and the third etch stop film 112 may be composed of the material similar as that of the second etch stop film 108 and the fourth etch stop film 118. In addition, although it is not shown here, each of the first etch stop film 102 and the third etch stop film 112 may also composed of a multiple-layered film including a first insulating film composed of the material similar as that of the second etch stop film 108 and the fourth etch stop film 118, and a second insulating film formed thereon and composed of the material similar as that of the first protective film 106 and the second protective film 116.

In addition to above, the lower layer interconnect 122, the via 128, the upper layer interconnect 134 or the like having the above-described configurations may be formed by the process operation, which is similar to that for forming the ordinary multiple-layered interconnect structure. This allows forming the electric fuse 200 without a need for adding a special operation.

As described above, for example, it may be configured that a periphery of the upper layer interconnect 134 is covered with a coating film such as the third barrier metal film 132 and the fourth etch stop film 118, and further the third interlayer insulating film 114 composed of a material that is softer than the coating film is formed in the periphery thereof. In addition, the upper layer interconnect 134 is formed to have a larger area along the direction in the surface of the semiconductor substrate than the via 128 and the lower layer interconnect 122.

Next, a procedure for cutting the electric fuse 200 having such configuration will be described. When a predetermined voltage is applied across the first terminal 202 and the second terminal 204 to apply an excessive power to the electric fuse 200, the electric conductor constituting the upper layer interconnect 134 of the electric fuse 200 expands, so that it expands toward a direction to the third interlayer insulating film 114, which is composed of a soft film. Due to the expansion of such electric conductor, a crack is generated in the third barrier metal film 132 or the like, so that the electric conductor that constitutes the upper layer interconnect 134 flows into the third interlayer insulating film 114 from the crack. More specifically, the electric conductor that constitutes the upper layer interconnect 134 flows out of the interconnect trench. This achieves forming the flowing-out region 142, as shown in FIG. 6B.

Further, since the electric conductor rapidly migrates toward the flowing-out region 142, the electric conductor is cut at the spot where the migration of the electric conductor can not keep up with other portions. In the present embodiment, the electric conductor is cut at the location of the via 128, thereby forming the void region 140. According to such mechanism, larger void region 140 is formed in the location remote from flowing-out region 142 by a certain distance.

In addition, since the second barrier metal film 126 is provided between the via 128 and the lower layer interconnect 122 in the present embodiment, the second barrier metal film 126 is easily peeled off from the lower layer interconnect 122, such that the void region 140 is easily formed between the second barrier metal film 126 and the lower layer interconnect 122.

Further, in the condition after cutting the electric fuse, the electric conductor that constitutes the via 128 migrates together with the second barrier metal film 126, thereby forming the void region 140 between the second barrier metal film 126 and lower layer interconnect 122. Therefore, even if a thermal processing is conducted after such process, the presence of the second barrier metal film 126 can prevent a re-connection with the lower layer interconnect 122 due to a re-migration of the electric conductor composed of a copper-containing metallic film. This allows providing an improved thermal resistance of the semiconductor device 100. Since the second barrier metal film 126 and the third barrier metal film 132 are provided to form a double-layered structure between the flowing-out region 142 and the void region 140, the migration of electric conductor can be further prevented.

When the electric fuse 200 having the configuration described in the present embodiment is to be cut by utilizing the phenomenon that the electric conductor migrates via an electromigration, the presence of the barrier metal film reduces the electromigration, and thus the cutting of such electric fuse with an improved efficiency is difficult. However, by selecting a crack assist type process for cutting the electric fuse 200 having such configuration, the electric conductor is at a super high-temperature during the cutting of the electric fuse 200 the barrier metal film of a refractory metal also migrates to allow an improved cutting of the electric fuse 200, and a migration in the later operation can be avoided to effectively prevent a re-connection.

Since the cutting of the electric fuse 200 is achieved via the crack assist type process of the mechanism as described above in the present embodiment, the void region 140 is formed necessarily in a region that is different from the region of the flowing-out region 142. This allows preventing the re-connection of the electric fuse 200.

While the above embodiment illustrates the exemplary implementation, in which a crack is created in the third barrier metal film 132 or the like, when the upper layer interconnect 134 is heated to expand, the fourth etch stop film 118 may be peeled off from the upper layer interconnect 134 or the second protective film 116, thereby creating a gap between these films. In such case, the electric conductor constituting the upper layer interconnect 134 flows into the gap to form the flowing-out region 142. Even in such case, the electric conductor migrates toward the flowing-out region 142, so that the cut part 214 is formed in a section of the via 128.

Figure 7A:
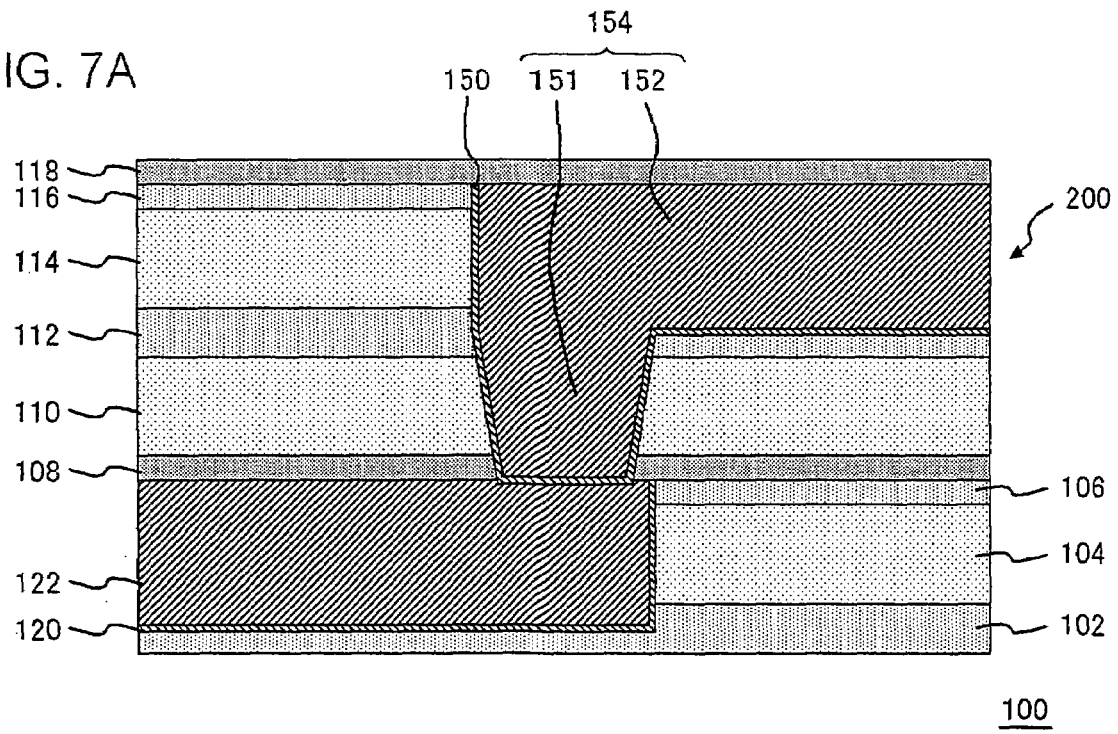
FIGS. 7A and 7B are diagrams, showing another example of cross-sectional views along line A-A' of FIGS. 5A and 5B, respectively.
Figure 7B:
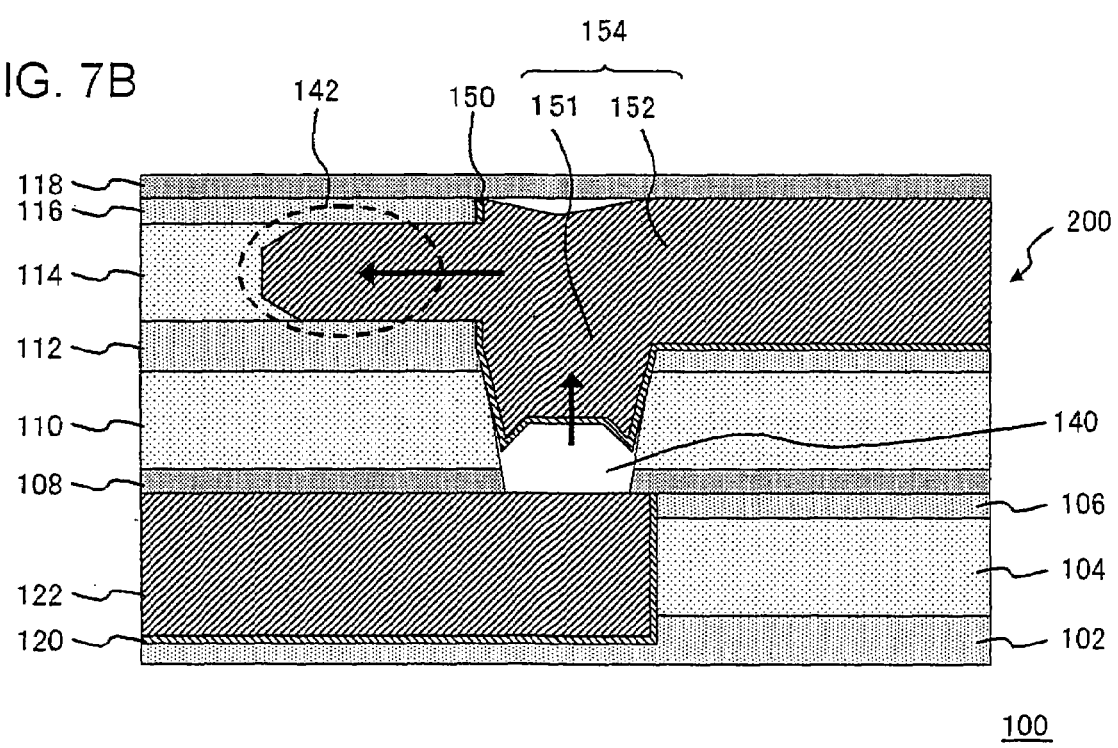
Figure 9:
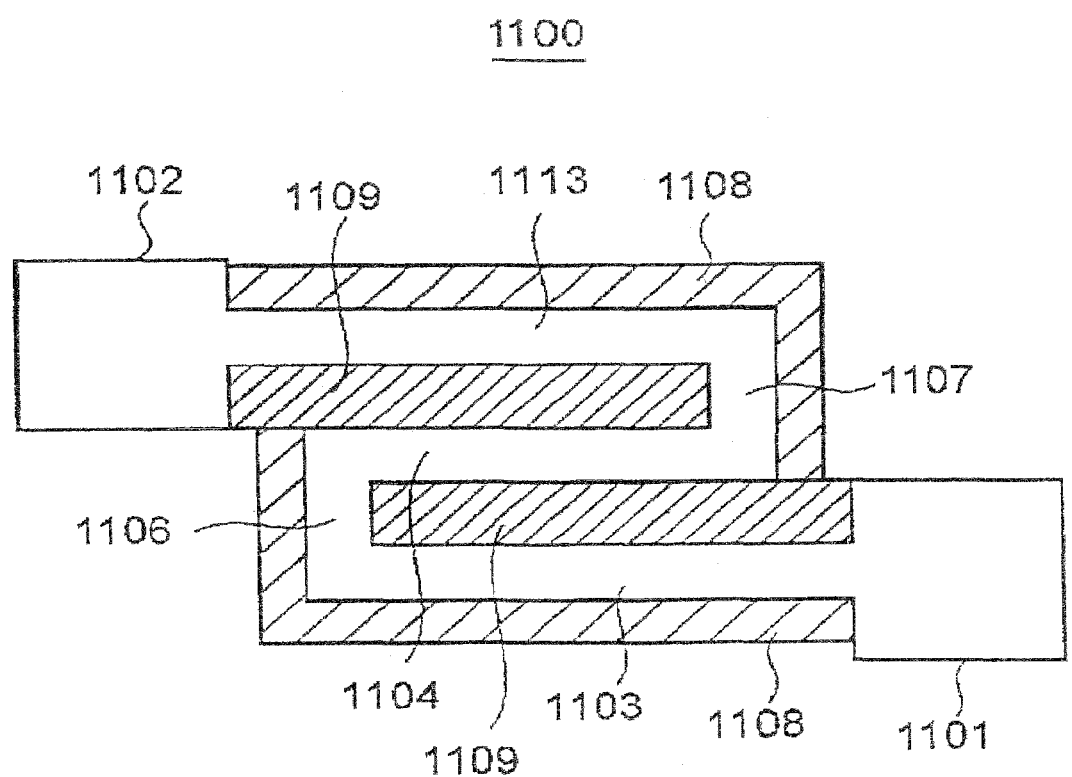
FIG. 9 is a plan view, showing a conventional electric fuse.

FIGS. 7A and 7B are diagrams, showing another example of the cross-sectional views along line A-A' of FIGS. 5A and 5B, respectively. FIG. 7A is a cross-sectional view, showing the configuration of the semiconductor device 100 before cutting the electric fuse 200, and FIG. 7B is a cross-sectional view, showing a configuration of the semiconductor device 100 after cutting the electric fuse 200. In this case, the configuration is different from the exemplary implementation shown in FIGS. 6A and 5B, in terms of the interconnect structure having a dual damascene structure.

In this case, a via 151 and an upper layer interconnect 152 are integrally formed to constitute a dual damascene interconnect 154. Before cutting, the electric fuse 200 is composed of the dual damascene interconnect 154 (via 151 and upper layer interconnect 152), which is electrically coupled to the lower layer interconnect 122 and the lower layer interconnect 122. The via 151 is formed in the second etch stop film 108, the second interlayer insulating film 110 and the third etch stop film 112. In addition, the upper layer interconnect 152 is formed in the third etch stop film 112, the third interlayer insulating film 114 and the second protective film 116.

The via 151 and the upper layer interconnect 152 may be composed of the material similar as that of the via 128 and the upper layer interconnect 134. In addition, the dual damascene interconnect 154 is configured that the side surfaces and the bottom surface thereof are covered with a fifth barrier metal film 150. The fifth barrier metal film 150 may also be composed of the material similar as that of the second barrier metal film 126, the third barrier metal film 132 or the like. In the condition before cutting the electric fuse 200, the fifth barrier metal film 150 is provided between the via 151 and the lower layer interconnect 122 so as to be in contact therewith.

When an excessive electric power is applied to the electric fuse 200 having the above-described configuration, the electric conductor constituting the upper layer interconnect 152 expands, so that it expands toward a direction to the third interlayer insulating film 114, which is composed of a soft film. Due to the expansion of such electric conductor, a crack is generated in the fifth barrier metal film 150 or the like, so that the electric conductor that constitutes the upper layer interconnect 152 flows into the third interlayer insulating film 114 therefrom. This achieves forming the flowing-out region 142, as shown in FIG. 7B.

Further, since the electric conductor rapidly migrates toward the flowing-out region 142, the electric conductor is cut at the spot where the migration of the electric conductor can not keep up with other portions. In the present embodiment, the electric conductor is cut at the location of the via 151, thereby forming the void region 140. In addition, since the fifth barrier metal film 150 is provided between the via 151 and the lower layer interconnect 122 in the present embodiment, the fifth barrier metal film 150 is easily peeled off from the lower layer interconnect 122, such that the void region 140 is easily formed between the fifth barrier metal film 150 and the lower layer interconnect 122.

Further, in the condition after cutting the electric fuse, the electric conductor that constitutes the via 151 migrates together with the fifth barrier metal film 150, thereby forming the void region 140 between the fifth barrier metal film 150 and lower layer interconnect 122. Therefore, even if a thermal processing is conducted after such process, the presence of the fifth barrier metal film 150 can prevent a re-connection with the lower layer interconnect 122, which is otherwise caused by a re-migration of the electric conductor composed of a copper-containing metallic film. This allows providing an improved thermal resistance of the semiconductor device 100.

EXAMPLES

FIG. 8 shows a cross-sectional view, which was formed by actually forming an electric fuse 200 having an interconnect structure of a single damascene structure similar as shown in FIG. 6A and then cutting the formed fuse via a crack assist type process. Here, an interlayer insulating film, in which the via 128 was formed, was composed of SiOC (Black Diamond, commercially available from Applied Materials Inc., Santa Clara, Calif., USA). Besides, an interlayer insulating film, in which the upper layer interconnect 134 was formed, was composed of SiOC (Aurora, commercially available from ASM International N.V., Holland). Both of the Black Diamond and the Aurora are porous films of SiOC, and the Aurora has lower specific dielectric constant, lower film density and composed of softer film than the Black Diamond.

As shown in the diagram, in the electric fuse 200, the flowing-out region 142 is formed at the upper layer interconnect 134, and the void region 140 is formed between the via 128 and the lower layer interconnect 122. Such electric fuse 200 having the flowing-out region 142 and the void region 140 formed therein was heated to 300 degree C. and left at such temperature for about five minutes, and then evaluation was conducted once again, and the result was that there was no re-connection.

Since the electric fuse 200 is composed of the multiple-layered interconnect structure according to the semiconductor device 100 including the electric fuse 200 in the present embodiment as described above, these can be arranged in the layered direction, thereby achieving a reduced area for forming the electric fuse.

In addition, since the via is cut, a probability of causing the re-connection of the electric conductor after the cutting can be reduced.

Further, if the electric fuses 200 are formed in one surface, there is a fear that the flowing-out region 142 may be possibly formed to bridge across the electric conductors, which otherwise should be electrically cut. When such phenomenon is caused, the cut electric fuse would be coupled to the flowing-out region 142, for example, thereby causing a reduced cutting yield (reduced resistance after the cutting), or an increased variation in the resistance after the cutting (variation with time). Since the void region 140 serving as a cut part and the flowing-out region 142 are formed in different layers in the present embodiment, such problem of creating a bridge can also be prevented.

It is to be understood that the invention is capable of using in various other combinations, modifications and environments, and any other interchanges in the expression between the method and device or the like according to the present invention may be effective as an alternative of an embodiment according to the present invention.

In addition, while exemplary implementations of forming the flowing-out region 142 at the portion of the upper layer interconnect 134 or the portion of the upper layer interconnect 152 have been described as described above, the flowing-out region 142 may alternatively be formed at a portion of the lower layer interconnect 122. For example, by forming the lower layer interconnect 122 to have the area in the direction in the surface of the semiconductor substrate, which is wider than the area of the upper layer interconnect 134, the flowing-out region 142 can be formed in a portion of the lower layer interconnect 122. In this case, the upper layer interconnect 134 corresponds to the first interconnect, and the lower layer interconnect 122 corresponds to the second interconnect. In particular, in the single damascene structure shown in FIGS. 6A and 6B, a barrier metal film is provided between via 128 and either the upper layer interconnect 134 and the lower layer interconnect 122. Therefore, even if the flowing-out region 142 is formed at any of the upper layer interconnect 134 and the lower layer interconnect 122, a re-connection can be effectively prevented.

It is apparent that the present invention is not limited to the above embodiment, and may be modified and changed without departing from the scope and spirit of the invention.

What is claimed is:

1. A semiconductor device, comprising:
   a semiconductor substrate; and
   an electric fuse formed on said semiconductor substrate and composed of an electric conductor,
   wherein said electric fuse includes a first interconnect, a via coupled to said first interconnect and a second interconnect coupled to said via, which are formed in different layers, respectively, in a condition before cutting said electric fuse, and said electric fuse comprises a void region formed between said first interconnect and said via or in said via, and a flowing-out region formed of said electric conductor flowing in a direction away from a periphery of said second interconnect and away from the void region, in a condition after cutting said electric fuse.

2. The semiconductor device as set forth in claim 1, wherein said electric conductor is composed of a copper-containing metallic film, which contains copper as a major constituent.

3. The semiconductor device as set forth in claim 2, wherein said electric fuse further includes a first barrier metal film provided between said first interconnect and said via such that said first barrier metal film is provided in contact with said first interconnect and said via, in said condition before cutting said electric fuse, and wherein said void region is formed between said first barrier metal film and said first interconnect, in said condition after cutting said electric fuse.

4. The semiconductor device as set forth in claim 3, wherein said electric fuse further includes a second barrier metal film on side surface of said second interconnect such that said second barrier metal film is provided in contact with said second interconnect, in said condition before cutting said electric fuse, wherein a crack is created in said second barrier metal film and said flowing-out region is formed of said electric conductor flowed from said crack, in said condition after cutting said electric fuse.

5. The semiconductor device as set forth in claim 2, wherein said electric fuse further includes a second barrier metal film on a side surface of said second interconnect such that said second barrier metal film is provided in contact with said second interconnect, in said condition before cutting said electric fuse, wherein a crack is created in said second barrier metal film and said flowing-out region is formed of said electric conductor flowed from said crack, in said condition after cutting said electric fuse.

6. The semiconductor device as set forth in claim 1, wherein said second interconnect is formed to have an area along a direction in a surface of said semiconductor substrate, which is larger than that of said first interconnect.

7. The semiconductor device as set forth in claim 1, further comprising an insulating layer formed in a periphery of said electric fuse on said semiconductor substrate, wherein said second interconnect is formed in an interconnect trench formed in said insulating layer, and wherein said flowing-out region is formed of said electric conductor flowed outside of said interconnect trench.

8. The semiconductor device as set forth in claim 1, further comprising an insulating layer formed in a periphery of said electric fuse on said semiconductor substrate, wherein said insulating layer includes a first insulating layer formed in a periphery of said via and a second insulating layer formed in a periphery of said second interconnect, said second insulating layer having a Young's modulus lower than that of said first insulating layer.

9. The semiconductor device as set forth in claim 8, wherein said second interconnect is formed in an interconnect trench formed in said second insulating layer, and wherein said flowing-out region is formed of said electric conductor flowed outside of said interconnect trench.

10. The semiconductor device as set forth in claim 1, further comprising an insulating layer formed in a periphery of said electric fuse on said semiconductor substrate, wherein said insulating layer includes a first insulating layer formed in a periphery of said via and a second insulating layer formed in a periphery of said second interconnect, said second insulating layer having a film density lower than that of said first insulating layer.

11. The semiconductor device as set forth in claim 10, wherein said second interconnect is formed in an interconnect trench formed in said second insulating layer, and wherein said flowing-out region is formed of said electric conductor flowed outside of said interconnect trench.

12. The semiconductor device as set forth in claim 1, further comprising an insulating layer formed in a periphery of said electric fuse on said semiconductor substrate, wherein said insulating layer includes a first insulating layer formed in a periphery of said via and a second insulating layer formed in a periphery of said second interconnect, said second insulating layer having a dielectric constant lower than that of said first insulating layer.

13. The semiconductor device as set forth in claim 12, wherein said second interconnect is formed in an interconnect trench formed in said second insulating layer, and wherein said flowing-out region is formed of said electric conductor flowed outside of said interconnect trench.

14. A semiconductor device, comprising:

a semiconductor substrate; and an electric fuse formed on said semiconductor substrate and composed of an electric conductor, wherein, in a first pre-cut condition of said electric fuse, said electric fuse comprises a first interconnect located on semiconductor layer, a second interconnect located on a second semiconductor layer, and a via coupling the first and second interconnects, the via located on a third semiconductor layer located between the first and second semiconductor layers, in a second post-cut condition of said fuse, said electric fuse further comprises a void region and a flowing-out region, said void region and said flowing-out region formed after cutting said fuse, said void region being intermediate said first interconnect and said via, said flowing out region being adjacent a terminal periphery end of said second interconnect, and in the first pre-cut condition of said electric fuse, said electric fuse being free of said void region and said flowing-out region.

* * * * *